United States Patent
Kim et al.

(10) Patent No.: US 9,595,652 B2
(45) Date of Patent: Mar. 14, 2017

(54) THERMOELECTRIC MATERIAL AND THERMOELECTRIC ELEMENT INCLUDING THE SAME

(71) Applicant: LG INNOTEK CO., LTD., Seoul (KR)

(72) Inventors: Sang Gon Kim, Seoul (KR); Sook Hyun Kim, Seoul (KR); Jong Bae Shin, Seoul (KR); Boone Won, Seoul (KR); Yong Sang Cho, Seoul (KR); Hyung Eui Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 108 days.

(21) Appl. No.: 14/607,217

(22) Filed: Jan. 28, 2015

(65) Prior Publication Data

US 2015/0214456 A1 Jul. 30, 2015

(30) Foreign Application Priority Data

Jan. 29, 2014 (KR) ........................ 10-2014-0010998
Jan. 29, 2014 (KR) ........................ 10-2014-0011386

(51) Int. Cl.
| | | |
|---|---|---|
| H01L 35/16 | (2006.01) | |
| H01L 35/18 | (2006.01) | |
| H01L 35/22 | (2006.01) | |
| C22C 32/00 | (2006.01) | |
| H01L 35/00 | (2006.01) | |
| C22C 1/04 | (2006.01) | |

(52) U.S. Cl.
CPC ............ *H01L 35/16* (2013.01); *C22C 1/0483* (2013.01); *C22C 32/0015* (2013.01); *C22C 32/0089* (2013.01); *H01L 35/00* (2013.01); *H01L 35/18* (2013.01); *H01L 35/22* (2013.01)

(58) Field of Classification Search
CPC .......... H01L 35/22; H01L 35/16; H01L 35/18
See application file for complete search history.

(56) References Cited

U.S. PATENT DOCUMENTS

2015/0020862 A1* 1/2015 Lee ..................... H01L 35/26
136/238

FOREIGN PATENT DOCUMENTS

| JP | 2005-223237 A | 8/2005 |
| KR | 10-2013-0074788 A | 7/2013 |
| WO | WO 2013/061739 A1 | 5/2013 |

OTHER PUBLICATIONS

Xion et al, "Effects of nano-TiO2 dispersion on the thermoelectric properties of fill-skutterudite Ba0.22Co4Sb12", Solid Stat5e Sciences, 11, Jun. 2009, pp. 1612-1616.*
Zhao et al, "Synthesis of YbyCo4Sb12/Yb2O3 composites and their thermoelectric propeties", Applied Physics Letters, 89, 092121-1 to 092121-3, Sep. 2006.*
Kim, Sun Jin et al., "Thermoelectric properties of P-type $Sb_2Te_3$ thick film process by a screen-printing technique and a subsequent annealing process"; Journal of Alloys and Compounds; vol. 582, Aug. 14, 2013; pp. 177-180.
We, Ju Hyung et al., "Development of a Measurement Method for the Thermal Conductivity of a Thick Film Prepared by a Screen-Printing Technique"; Journal of Electronic Materials, vol. 41, No. 6, Jan. 6, 2012, pp. 1170-1176.
Kato, Kunihisa et al., "Fabrication of Bismuth Telluride Thermoelectric Films Containing Conductive Polymers Using a Printing Method"; vol. 42, No. 7, Feb. 14, 2013, pp. 1313-1318.
Extended European Search Report dated Nov. 11, 2015 issued in corresponding Application No. 15 15 3112.6.
Partial European Search Report dated Jul. 7, 2015 issued in Application No. 15153112.6.
Zhou M et al: "Effects of partial substitution of Co by Ni on the high-temperature thermoelectric properties of TiCoSb-based half-Heusler compounds", Journal of Alloys and Compounds, Elsevier Sequoia, Lausanne, CH, vol. 391, No. 1-2, Apr. 5, 2005, pp. 194-197, XP027811828, ISSN: 0925-8388 [retrieved on Apr. 5, 2005].
Zhao X et al: "Synthesis of YbyCo4Sb12/Yb2O3 composites and their thermoelectric properties", Applied Physics Letters, American Institute of Physics, US, vol. 89, No. 9, Sep. 1, 2006, pp. 92121-092121, XP012088746, ISSN: 0003-6951, DOI: 10.1063/1.2345249.
Xiong Z et al: "Effects of nano-Ti02 dispersion on the thermoelectric properties offilled-skutterudite Ba0.22Co4Sb12", Solid State Sciences, Elsevier, Paris, FR, vol. 11, No. 9, Sep. 1, 2009, pp. 1612-1616, XP026519769, ISSN: 1293-2558, DOI: 10.1016/J.SOLIDSTATESCIENCES.2009.06.007 [retrieved on Jun. 16, 2009].
Yi Ma et al: "Composite thermoelectric materials with embedded nanoparticles", Journal of Materials Science, Kluwer Academic Publishers, BO, vol. 48, No. 7 , Nov. 13, 2012, pp. 2767-2778, XP035163966, ISSN: 1573-4803, DOI: 10.1007/510853-012-6976-Z.

* cited by examiner

*Primary Examiner* — Carol M Koslow
(74) *Attorney, Agent, or Firm* — KED & Associates, LLP

(57) ABSTRACT

Provided is a thermoelectric material including metal oxide powder and thermoelectric powder. Thus, an internal filling rate is improved so that a Peltier effect can be maximized according to the increase of electrical conductivity and a Seebeck coefficient and the reduction of thermal conductivity, thereby enabling the improvement of the figure of merit (ZT) of a thermoelectric element.

14 Claims, 8 Drawing Sheets

THERMOELECTRIC MATERIAL AND THERMOELECTRIC ELEMENT INCLUDING THE SAME

CROSS-REFERENCE TO RELATED APPLICATIONS

This application claims priority under 35 U.S.C. §119 to Korean Application No. 10-2014-0010998, filed on Jan. 29, 2014 and Korean Patent Application No. 10-2014-0011386, filed on Jan. 29, 2014, in the Korean Intellectual Property Office, whose entire disclosures are hereby incorporated by reference.

BACKGROUND

1. Field

Embodiments of the present disclosure relate to a thermoelectric element having improved thermoelectric efficiency and a method of manufacturing the same.

2. Background

A thermoelectric effect means a reversible, direct energy conversion generated between heat and electricity and is generated by electron and hole transfer performed in the inside of a material. Such a thermoelectric effect is divided into a Peltier effect and a Seebeck effect, the Peltier effect being applied to the cooling field using a temperature difference in both ends formed by a current applied from the outside, and the Seebeck effect being applied to the power generation field using an electromotive force generated due to the temperature difference in both ends of the material.

The biggest factor to limit the application of thermoelectric cooling and power generation is the low energy conversion efficiency of a material. The performance of a thermoelectric material is commonly called the dimensionless figure of merit. A value of the figure of merit ZT defined by the following Equation is used.

$$ZT = \frac{S^2 \sigma T}{\kappa} \qquad \text{[Equation 1]}$$

Here, ZT represents the figure of merit, S represents a Seebeck coefficient, $\sigma$ represents electric conductivity, T represents an absolute temperature, and $\kappa$ is thermal conductivity.

However, electrical conductivity and a Seebeck coefficient have a correlation in which when performance of one of them is increased, performance of another one is decreased. Thus, as shown in Equation 1, in order to increase the figure of merit of a thermoelectric material, researches for increasing a Seebeck coefficient and electrical conductivity and reducing thermal conductivity have been performed.

As one example of technologies resulting from these researches, a conventional cooling thermoelectric element has been mainly produced in a bulk type. However, since the bulk-type thermoelectric element has a small scattering effect of phonons, it has the low figure of merit. Thus, improvement has been needed for the bulk-type thermoelectric element.

Also, as shown in Equation 1, electrical Conductivity and the Seebeck coefficient corresponding to main variables determining the ZT value have a correlation in which when performance of any one of them is increased, performance of another one is decreased. Thus, even though thermal conductivity is decreased when the Seebeck coefficient is increased according to a decrease of the concentration of a carrier, a trade off property showing the decrease of an electrical conductivity property is generated.

The conventional bulk-type thermoelectric element has a low competitive price because it is based on Bi—Te. Thus, the conventional bulk-type thermoelectric element has been only used in limited fields such as expensive equipment or the aerospace industry. Also, since the conventional bulk-type thermoelectric element has no flexibility, it cannot be used in a surface with curvature. Thus, it is difficult to variously utilize it. Accordingly, the development of a thermoelectric having a competitive price and a flexible property has been necessarily needed.

BRIEF DESCRIPTION OF THE DRAWINGS

The embodiments will be described in detail with reference to the following drawings in which like reference numerals refer to like elements wherein.

Figure 6:
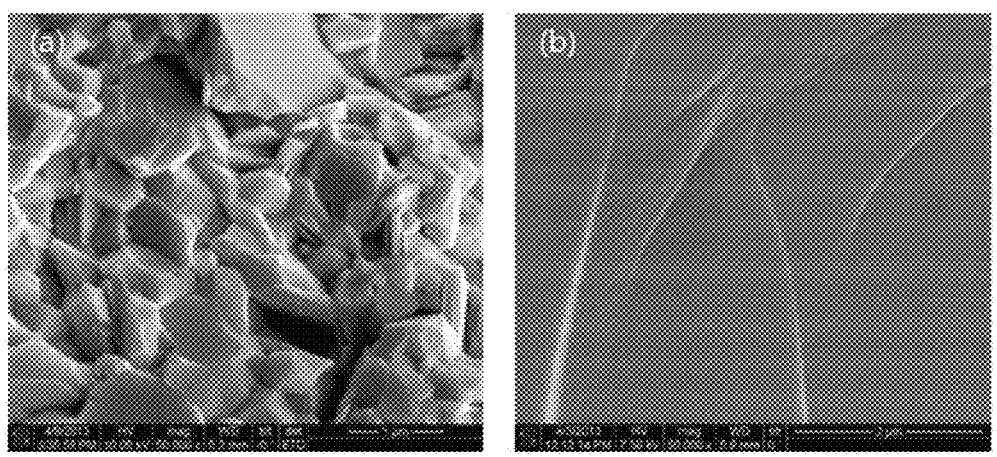
Figure 7:
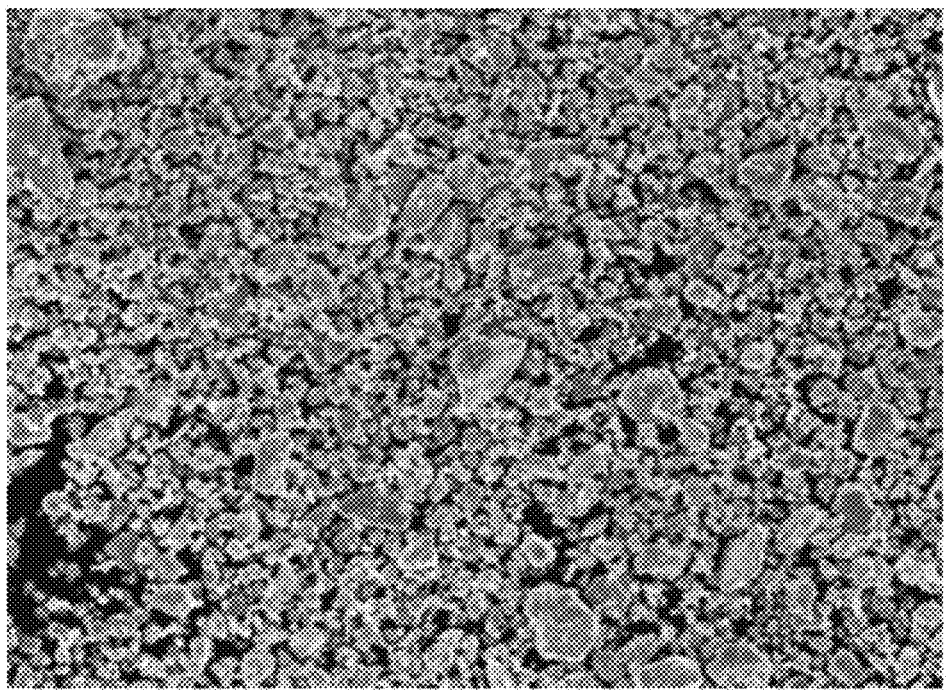
Figure 8:
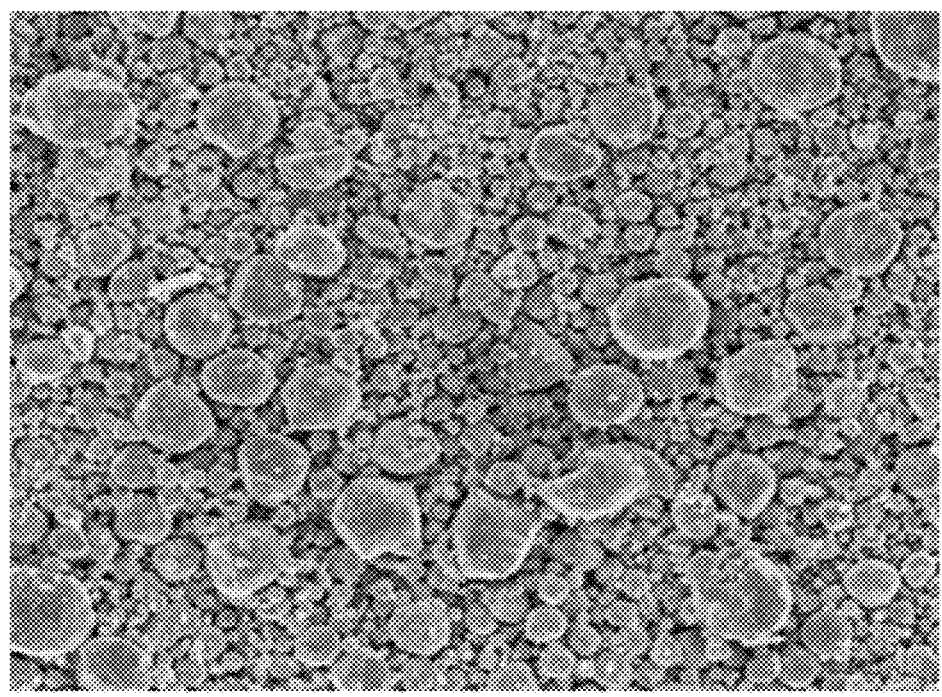
Figure 9:
Figure 10:
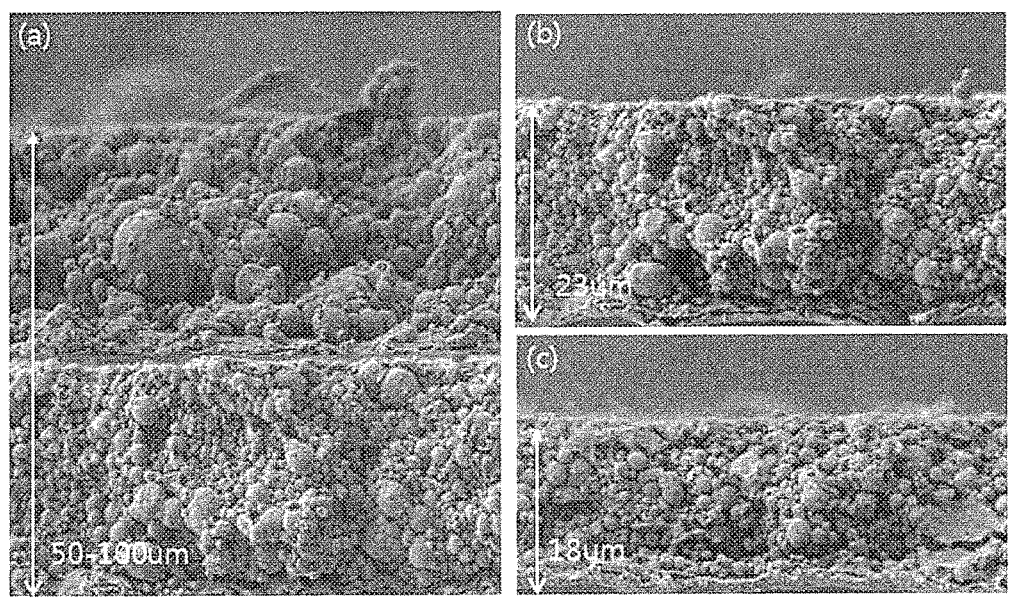
Figure 11:
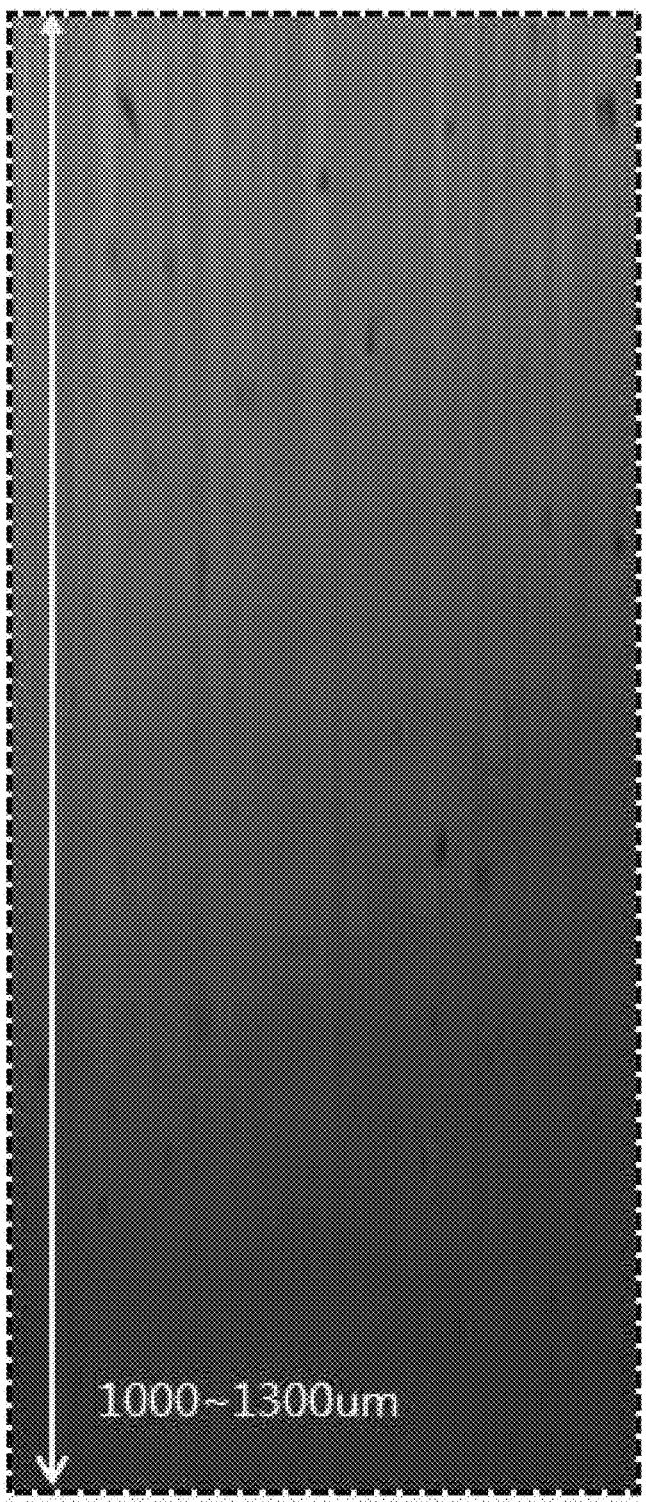
Figure 12:
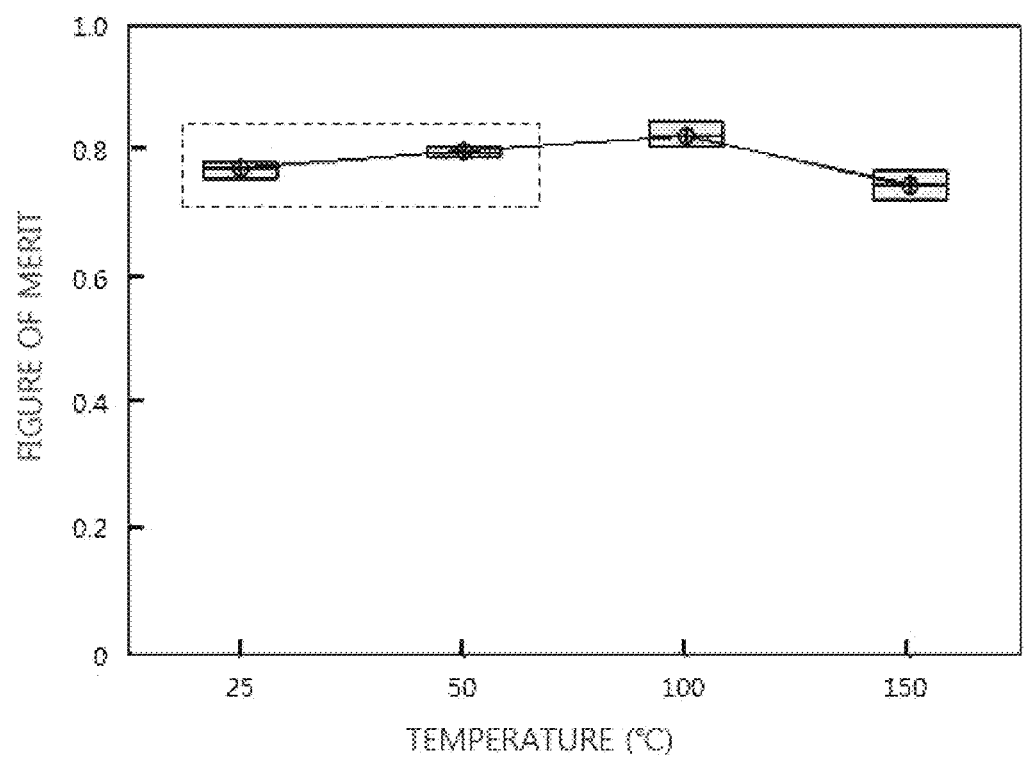

(A) of FIG. 6 is an SEM (Scanning Electron Microscope) photo resulting from the observation of a microstructure of a pellet for the thermoelectric element according to the embodiment of the present disclosure, (B) of FIG. 6 is an SEM (Scanning Electron Microscope) photo resulting from the observation of a microstructure of a pellet for a thermoelectric element produced in a comparative example;

FIG. 7 is a photo showing a first thermoelectric powder having a particle size of 1 to 3 μm according to an embodiment of the present disclosure;

FIG. 8 is a photo showing a second thermoelectric powder having a particle size of 6 to 8 μm according to an embodiment of the present disclosure;

FIG. 9 is a photo showing glass frit according to an embodiment of the present disclosure;

FIG. 10 photos a-c are photos resulting from observing a cross section of a thick film thermoelectric element produced according to the embodiment of the present disclosure using the Scanning Electron Microscope;

FIG. 11 is a photo resulting from observing a cross section of a conventional bulk-type thermoelectric element using the Scanning Electron Microscope;

FIG. 12 is a graph showing the figure of merit of the thick film thermoelectric element resulting from evaluating performance of the thermoelectric element according to the embodiment of the present disclosure; and

DETAILED DESCRIPTION

Hereinafter, the configurations and operations according to embodiments of the present disclosure will be described in detail with reference to the accompanying drawings. The present disclosure may, however, be embodied in different forms and should not be construed as limited to the embodiments set forth herein. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms are only used for the purpose for distinguishing a constitutive element from other constitutive element. As used herein, the singular forms "a," "an" and "the" are intended to include the plural forms as well, unless the context clearly indicates otherwise.

First Embodiment

A thermoelectric material according to a first embodiment of the present disclosure may include: thermoelectric powder including at least one element selected from the group consisting of Bi, Sb, Te and Se; and metal oxide powder having a cross section with a width and a thickness and having a length extending from the cross section. In particular, the metal oxide powder has a rod form. The rod form is defined as a structure having a regular cross section and length.

Specifically, the nanocrystalline thermoelectric material for a thermoelectric element according to the first embodiment includes the metal oxide powder having the rod form and the thermoelectric powder and is implemented in a bulk form. The thermoelectric material according to the first embodiment is configured such that the thermoelectric powder is independently introduced in the inside of the bulk thermoelectric material, and the particles of the metal oxide powder having the rod form are doped between the particles of the thermoelectric powder. Thermal conductivity may be decreased by inducing the scattering of phonons and by interrupting the free movement of electrons. Accordingly, in the bulk thermoelectric material at a level of several μm to several cm, a phonon blocking-electron transmitting structure may be formed. Due to this, electric conductivity and a Seebeck coefficient, namely, a power factor are maintained in a similar level, and thermal conductivity is reduced, thereby enabling improvement of the figure of merit.

The thermoelectric powder according to the present embodiment is Bi, Sb, Te, Se, or a complex thereof. For example, a thermoelectric material matrix formed by the thermoelectric powder particles has an empirical formula: $[A]_2[B]_3$, (where, A represents Bi and/or Sb, and B represents Te and/or Se). When the thermoelectric material matrix is a P-type, the detailed empirical formula thereof may be $Bi_{2-x}Sb_xTe_3$ (where, 0<x<1.5). Also, when the thermoelectric material matrix is an N-type, the empirical formula thereof may be $Bi_2Te_{3-y}Se_y$ (where, 0.1<y<0.2). The thermoelectric material matrix according to the present embodiment of the invention may further include Ag or Cu as an additive. Ag or Cu may be added in an amount of 0.01 to 0.1 wt % based on a total weight of the P-type thermoelectric element, and Ag or Cu may be added in an amount of 0.01 to 0.1 wt % based on a total weight of the N-type thermoelectric element.

Particles each having a particle size of 10 to 100 μm and particles each having a particle size of more than 100 μm may be contained in the thermoelectric powder at a ratio of 7:3 or 3:7. When the particles of the thermoelectric powder has an uniform size in the range above, the density of an internal structure thereof may be increased, and scattering of phonons may be maximized. Due to this, the phonon blocking-electron transmitting effect can be increased. Also, the thermoelectric material according to the present embodiment of the invention has a bulk form so that a production process can be simplified and a production cost can be reduced. Also, the thermoelectric material has high process efficiency, high availability in a large area, and the easy of adjustment of a crystalline size, and high utilization.

In order to improve the figure of merit ZT of the thermoelectric element, as can be seen from Equation 1, a material for increasing electric conductivity σ or reducing thermal conductivity should be used. A metal used in conventional thermoelectric elements have a limit in improving the figure of merit according to Wiedemann-Franz Law (this law is that ratios of the electronic contribution of thermal conductivity (κ) to electrical conductivity (σ) of all metals are almost approximately equal to each other at the same temperature, and since both the thermal conductivity and the electrical conductivity result from an electron transport phenomenon, this law is applied to the metals). However, when a metal oxide is added to the thermoelectric material, an effect of the improvement of performance may be obtained by scattering phonons without interrupting electron behaviors. That is, when the metal oxide is mixed with the thermoelectric element, electrical conductivity is increased and thermal conductivity is reduced, thereby enabling improvement of the figure of merit.

Figure 1:
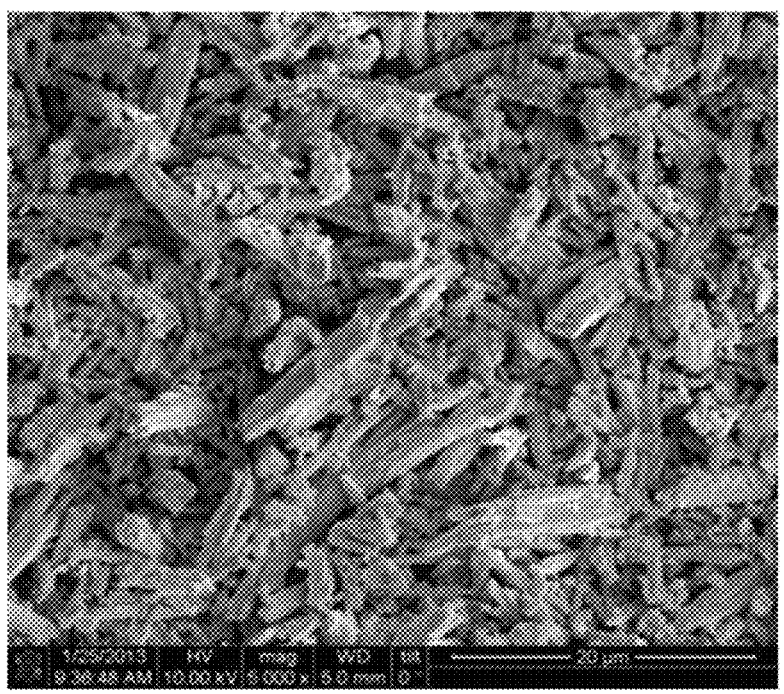
FIG. 1 is an SEM (Scanning Electron Microscope) photo resulting from the observation of metal oxide powder added to a thermoelectric element according to an embodiment of the present disclosure.
Figure 2:
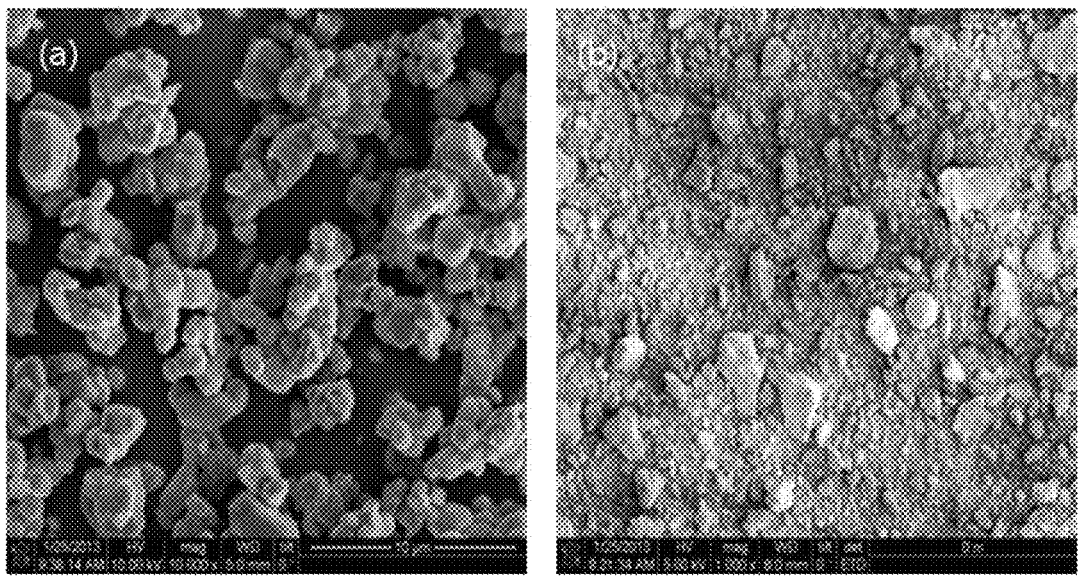
FIG. 2 photos a and b are SEM (Scanning Electron Microscope) photos resulting from the observation of metal oxide powder added to a conventional thermoelectric element.
Figure 3:
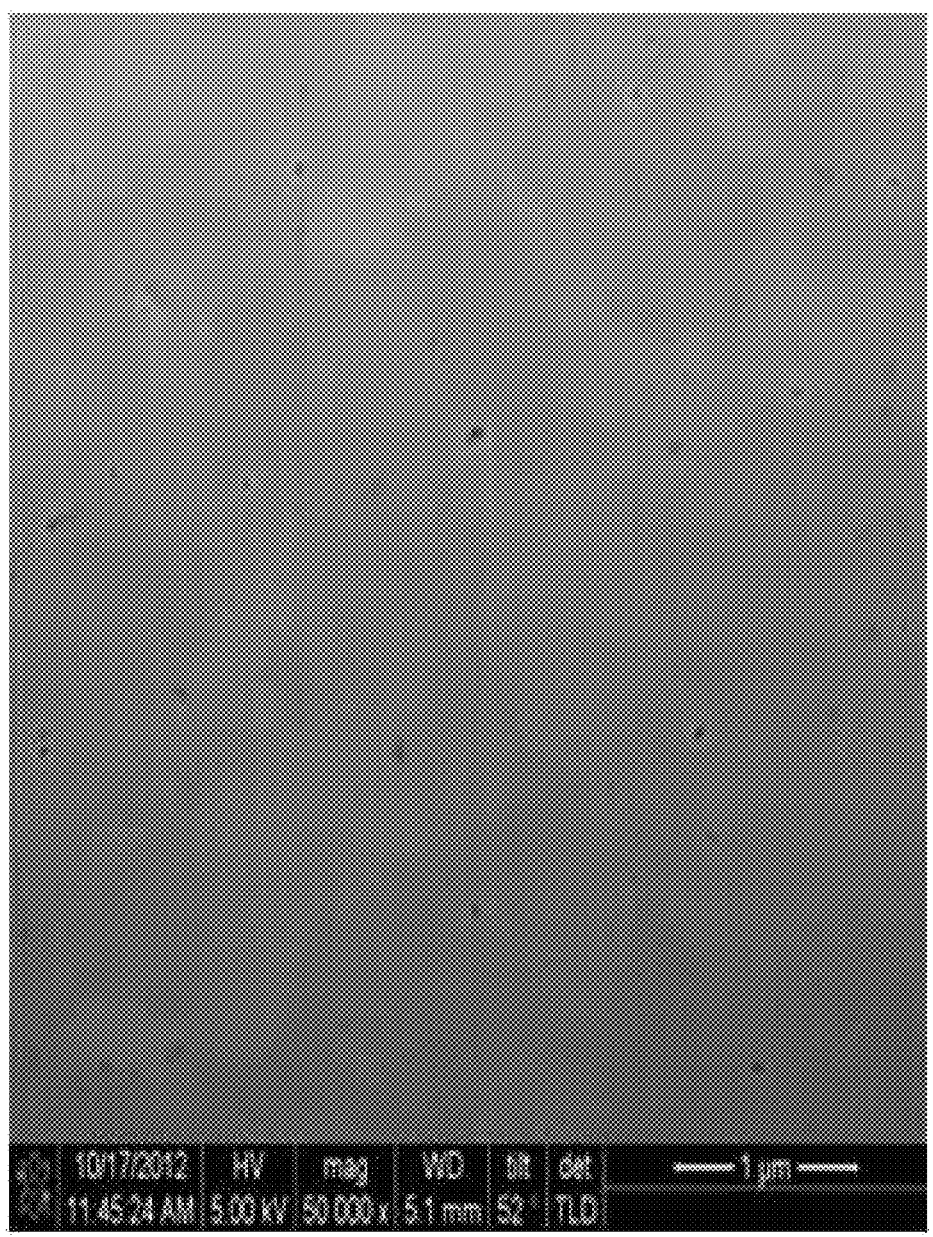
FIG. 3 is an SEM (Scanning Electron Microscope) photo resulting from the observation of a cross section of the conventional thermoelectric element.

FIG. 1 is an SEM (Scanning Electron Microscope) photo resulting from the observation of metal oxide powder added to a thermoelectric element according to an embodiment of the present disclosure. Referring to FIG. 1, the metal oxide powder according to the present embodiment may have a rod form. Also, the metal oxide powder may be minute particles in which the particles in the rod form agglomerate or which has a layered structure. An aspect ratio of the metal oxide powder may be 1:5 to 1:20. That is, each particle of the metal oxide powder has a length of 1 to 100 μm and a particle size of 10 nm to 10 μm and is a linear micro particles having a long length compared to a width. The metal oxide powder used as the additive of a thermoelectric material for the conventional thermoelectric element contains particles each having a globular form or an almost similar atypical form to the globular form as illustrated in FIG. 2 ((a) of FIG. 2 shows CuO, (b) of FIG. 2 shows NiO. When a pellet for the bulk thermoelectric element is manufactured by adding atypical minute particles having a globular form or an almost similar atypical form to the globular form, a grain boundary is increased compared to a case in which atypical minute particles are not added (see FIG. 3), thereby enabling a reduction of thermal conductivity by causing scattering of phonons. However, when the grain boundary is increased, a mean free path of an electron or a positive hole is reduced, thereby causing a reduction of electrical conductivity. Thus, a large effect of improvement in the figure of merit may not be realized.

Figure 4:
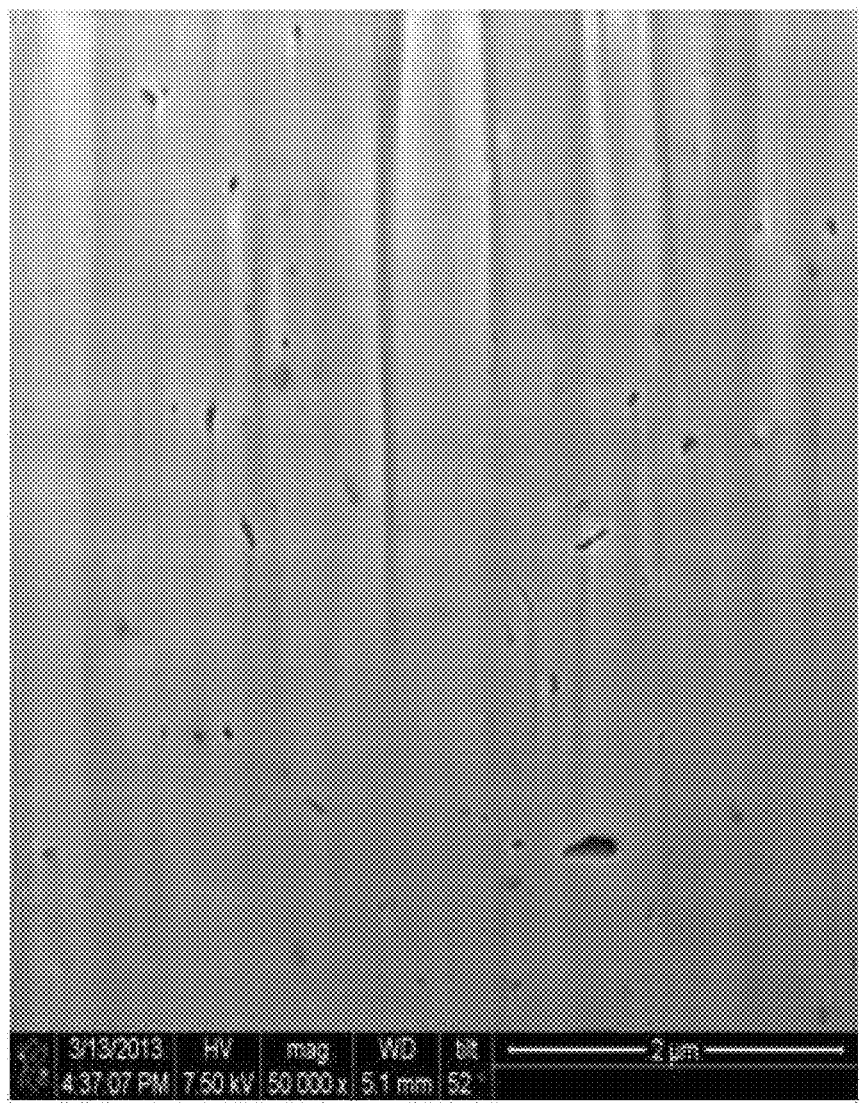
FIG. 4 is an SEM (Scanning Electron Microscope) photo resulting from the observation of a cross section of the thermoelectric element according to the embodiment of the present disclosure.

FIG. 4 is an SEM (Scanning Electron Microscope) photo resulting from the observation of a cross section of the thermoelectric element according to the embodiment of the present disclosure. As shown in FIG. 4, the microstructure includes a grain boundary having an aspect ratio of at least 1:5 or more. Like a case in which conventional atypical metal oxide power having a globular form or an almost similar form to the globular form is used, the grain boundary is increased by an increase in the number of particles. However, in the present embodiment, thanks to a particle form of the thermoelectric material having a large aspect ratio, a mean free path in a longitudinal direction is increased compared to the case in which conventional atypical metal oxide power having a globular form or an almost similar form to the globular form is used, thereby enabling a small or minimal reduction of electrical conductivity. Accordingly, the figure of merit ZT can be improved.

In the present embodiment, the metal oxide having the rod form may be $Bi_2O_3$. A form and physical properties of $Bi_2O_3$ are shown in Table 1 below.

TABLE 1

| Property of Additive | Form | Size | Molecular Weight | Melting Point (° C.) | Density (g/cm³) | Gibbs Energy (kJ/mol, at 25° C.) |
|---|---|---|---|---|---|---|
| $Bi_2O_3$ | Rod-like shape | 10 nm~10 μm | 465.959 | 817 | 8.9 | −329.1 |

$Bi_2O_3$ includes five polymorphs in terms of a crystal structure. $Bi_2O_3$ dominantly has the form of α-$Bi_2O_3$ phase at room temperature, and α-$Bi_2O_3$ has a monoclinic crystal structure. Also, according to the increase of a temperature, $Bi_2O_3$ has each form such as β-$Bi_2O_3$ phase having a tetragonal crystal structure, γ-$Bi_2O_3$ phase having a body centered cubic crystal structure, δ-$Bi_2O_3$ phase having a simple cubic crystal structure, and the like. The monoclinic crystal structure of α-$Bi_2O_3$ and the tetragonal crystal structure of β-$Bi_2O_3$ refer to a structure in which, among crystal axes a, b, c, axis c has the longest length. That is, according to a crystal growth, a crystal phase having a large aspect ratio is obtained.

In the present embodiment, the metal oxide powder may be added in an amount of 0.01 to 0.5 wt % based on the total weight of the thermoelectric material. More preferably, the metal oxide powder may be added in an amount of 0.1 to 0.3 wt % based on the total weight of the thermoelectric material. When the metal oxide powder is added in the amount of less than 0.01 wt %, this hardly has an effect on thermal conductivity and electrical conductivity of the thermoelectric material. Thus, an effective increase of the figure of merit cannot be expected. On the contrary, when the metal oxide powder is added in the amount of more than 0.5 wt %, a grain boundary is excessively increased, so electrical conductivity may be reduced.

The thermoelectric element according to another aspect of the present embodiment is made of a bulk nanocrystalline thermoelectric material for the thermoelectric element including metal oxide powder and thermoelectric powder. Since the description of the thermoelectric material, as well as the metal oxide powder and the thermoelectric powder, has been performed, the description thereof is omitted for avoiding overlapping.

A method of manufacturing the thermoelectric element according to one aspect of the present embodiment is the following. First, an ingot, which is the precursor of a thermoelectric material, is produced in a furnace having a high temperature of 500° C. to 1000° C. The method of manufacturing the ingot is publicly known in the relevant technical field. In the present disclosure, the method is not specifically limited if it enables forming of a precursor capable of constituting a matrix made of a thermoelectric material during a sintering process which will be performed later. Then, the ingot is pulverized and mixed to be produced as thermoelectric material powder having a nanoscale micro diameter. Also, metal oxide powder is mixed during the pulverizing and mixing process to be pulverized and mixed with the thermoelectric powder. The metal oxide powder may be mixed in an amount of 0.01 to 5.0 wt % with respect to the total weight of the thermal material. At this time, in the present embodiment, the method of pulverizing and mixing the metal oxide powder is not specifically limited, and publicly known methods may be used. However, in consideration of the convenience of a production process, a mechanical pulverization method such as milling and the like may be used. The milling method is a method of pulverizing raw material powder by rotating the raw material powder, a steel ball and the like in a state of being put in a jar made of a sintered carbide so as to the steel ball to mechanically apply an impact to the raw material powder. Specifically, examples of the mill method include a vibration ball mill method, a rotating ball mill method, a planetary ball mill method, an attrition mill method, a specs mill method and a jet mill method, a bulk mechanical alloying method and the like without being limited thereto. Preferably, minute thermoelectric material powder may be obtained using the jet mill method which is a drying process. The jet mill method is a pulverizing method using the mutual impacts of pulverized materials generated by energy sprayed from a nozzle by air pressure.

When the pulverizing and mixing process of the ingot is completed, power in which the thermoelectric powder and the metal oxide powder are mixed may be obtained. The thermoelectric powder contained in the mixed powder has a particle size in the wide range of from several nm to several μm. According to the conventional art, since a thermoelectric element is obtained by sintering the minute thermoelectric material powder as it is, and particle sizes of the thermoelectric powder contained in the thermoelectric element are not uniform, thermoelectric efficiency is not largely improved. Accordingly, in order to make a particle size of the thermoelectric powder minute and to enable the thermoelectric powder to contain particles having a uniform size, after obtaining the mixed powder, the thermoelectric powder is subjected to sieving using a sieve of 400 meshes for particles each having a particle size of less than 100 μm.

Also, a tray including the sieve may include at least two sieves with the same mesh size so as to have different directions at an angle of 0° to 90°. Preferably, at least two sieves may be formed to overlap each other in a misaligned direction at an angle of 45°. The mixed powder of the thermoelectric powder and the metal oxide powder sieved via the sieves are constituted of particles having a more uniform and minute particle size. Accordingly, in the manufacturing method of the thermoelectric element of the present disclosure, the thermoelectric material powder sieved via the tray including at least two sieves is used so that uniformity can be largely increased and high density thermoelectric powder can be obtained.

Figure 5:
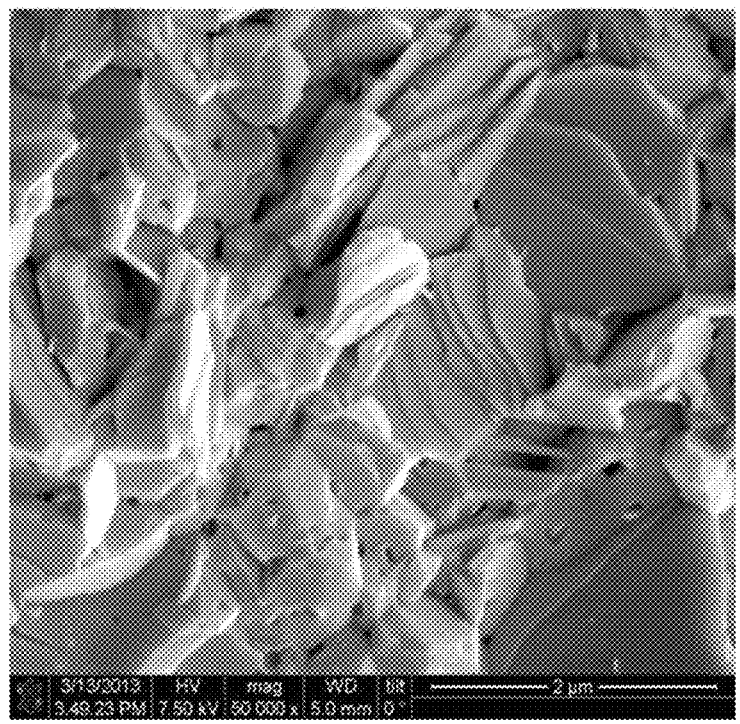
FIG. 5 is an SEM (Scanning Electron Microscope) photo resulting from the observation of a microstructure of a pellet for the thermoelectric element according to the embodiment of the present disclosure.

Then, the mixed powder of the thermoelectric powder and the metal oxide power is produced as a pellet for a thermoelectric element via sintering. FIG. 5 is an SEM (Scanning Electron Microscope) photo resulting from observing a microstructure of the pellet for the thermoelectric element according to the present embodiment. Through FIG. 5, the microstructure of the pellet having a spark and layer structure can be confirmed. A sintering method commonly used in the relevant business world may be used in the sintering process. For example, a hot pressing method, a spark plasma sintering method or the like may be used. The sintering process may be performed in a state where the mixture containing the mixed powder of the thermoelectric power and the metal oxide powder is put in a mold. At this time, when the spark plasma sintering method is used, the sintering process may be performed in a short time. Thus, by improving crystallographic orientation and facilitating structure densification and control, a thermoelectric material having excellent mechanical strength can be produced. For example, the spark plasma sintering method may be performed in such a manner that the mold in which the mixed powder is accommodated is provided in a vacuum state, and thereafter, gas is injected into the mold to apply pressure to the mold, and the mixed powder is subjected to plasma treatment in a plasma zone in the center of the mold. Ar, $H_2$, $O_2$ and the like may be used as the gas without being limited thereto. When pressure in a chamber is too high or low upon the plasma process, it is difficult to enable plasma occurrence or treatment. Thus, the plasma process may be performed at a pressure of 50 to 200 kN. Also, when the plasma treatment time is too short or a heating rate is too slow, it is difficult to sufficiently perform the plasma treatment. Thus, the plasma process may be performed at a temperature of 200 to 600° C. and a heating rate of 25 to 50° C./min for 1 to 10 minutes. When the thermoelectric element is produced using the spark plasma sintering method, the thermoelectric element may be formed in a bulk form in a state where a nanostructure or a nano size of the thermoelectric powder is maintained.

The present disclosure will be hereinafter described in greater detail based on examples. The examples have been disclosed for illustrative purposes and the present disclosure may, however, be embodied in different forms and should not be construed as limited to the examples set forth herein.

PRODUCTION EXAMPLE

Production Example 1

Production of a P-Type Ingot

Weighing of each of Bi, Sb, and Te samples was performed to form the condition of $Bi_{0.5}Sb_{1.5}Te_3$, and the samples were sealed in an inactive atmosphere in a state of being accommodated in a quartz tube. Then, the samples accommodated in the quartz tube were put in a furnace and melted at a temperature of 800° C. for 10 hours, and the melted samples were subjected to quenching to produce an ingot.

Production Example 2

Production 1 of an N-Type Ingot

Weighing of each of Bi, Sb, and Te samples was performed to form the condition of $Bi_2Te_{2.70}Se_{0.30}$, and the samples were sealed in an inactive atmosphere in a state of being accommodated in a quartz tube. Then, the samples accommodated in the quartz tube were put in a furnace and melted at a temperature of 800° C. for 10 hours, and the melted samples were subjected to quenching to produce an ingot.

Production Example 3

Production 2 of an N-Type Ingot

Weighing of each of Bi, Sb, and Te samples was performed to form the condition of $Bi_{1.99}Te_{2.68}Se_{0.28}+Cu_{0.05}$, and the samples were sealed in an inactive atmosphere in a state of being accommodated in a quartz tube. Then, the samples accommodated in the quartz tube were put in a furnace and melted at a temperature of 800° C. for 10 hours, and the melted samples were subjected to quenching to produce an ingot.

Example

Examples 1 and 2

Production of a Pellet for a Thermoelectric Element

The ingots and $Bi_2O_3$ (0.25 wt % based on the total weight) obtained in Production Examples 2 and 3 were put in a ball mill, the ingots and the oxide material were pulverized and mixed for 5 hours, and the mixed powder was subjected to sieving using a sieve of 400 meshes to obtain thermoelectric powder.

Then, the thermoelectric powder was put into a sintering mold and was sintered at a pressure of 60 MPa and a temperature of 420° C. for 30 minutes using hot press equipment to produce a pellet for a thermoelectric element, and a minute structure of the pellet was observed using the Scanning Electron Microscope and was illustrated in FIG. 6(a).

COMPARATIVE EXAMPLE

Comparative Examples 1 and 2

The ingots and $Bi_2O_3$ obtained in Production Examples 2 and 3 were put in a ball mill, the ingots and the oxide material were pulverized and mixed for 5 hours, and the mixed powder was subjected to sieving using a sieve of 400 meshes to obtain thermoelectric powder.

Then, the thermoelectric powder was put into a sintering mold and was sintered at a pressure of 60 MPa and a temperature of 420° C. for 30 minutes using hot press equipment to produce a pellet for a thermoelectric element, and a minute structure of the pellet was observed using the Scanning Electron Microscope and was illustrated in FIG. 6(b).

[Evaluation]

The thermoelectric element produced in each of the examples and the comparative examples was sintered using SPS (Spark Plasma Sintering) equipment to obtain a pellet, and the pellet was cut in a size of 2.0×2.0×10 mm. Then, an electrical conductivity and a Seebeck coefficient were measured and evaluated using ZEM-3 equipment, and a thermal conductivity was measured and evaluated using LFA447 equipment. Thus, the results thereof were shown in Table 2 to 5 below. Tables 2 and 3 below relate to Examples 1 and 2, and Tables 4 and 5 below relate to Comparative Examples 1 and 2.

TABLE 2

| [Example 1: adding $Bi_2Te_{2.70}Se_{0.30}$ and $Bi_2O_3$] | | | | |
|---|---|---|---|---|
| Temperature (° C.) | FIGURE of Merit (ZT) | Electrical Conductivity (σ) | Seebeck Coefficient (V/° C.) | Thermal Conductivity (κ) |
| 25 | 0.85570 | $5.90 \times 10^4$ | $-2.21 \times 10^{-4}$ | 1.00081 |
| 50 | 0.90166 | $5.59 \times 10^4$ | $-2.22 \times 10^{-4}$ | 0.98605 |
| 100 | 0.93433 | $4.91 \times 10^4$ | $-2.25 \times 10^{-4}$ | 0.99136 |
| 150 | 0.79697 | $4.46 \times 10^4$ | $-2.14 \times 10^{-4}$ | 1.08088 |

TABLE 3

[Example 2: adding Bi$_{1.99}$Te$_{2.68}$Se$_{0.28}$ + Cu$_{0.05}$, Bi$_2$O$_3$]

| Temperature (° C.) | FIGURE of Merit (ZT) | Electrical Conductivity (σ) | Seebeck Coefficient (V/° C.) | Thermal Conductivity (κ) |
|---|---|---|---|---|
| 25 | 1.10631 | 5.14 × 10$^4$ | −2.60 × 10$^{-4}$ | 0.93845 |
| 50 | 1.25743 | 4.73 × 10$^4$ | −2.78 × 10$^{-4}$ | 0.93951 |
| 100 | 1.01902 | 4.22 × 10$^4$ | −2.51 × 10$^{-4}$ | 0.97353 |
| 150 | 0.76526 | 4.03 × 10$^4$ | −2.22 × 10$^{-4}$ | 1.10049 |

TABLE 4

[Comparative Example: non-addition of Bi$_2$Te$_{2.70}$Se$_{0.30}$, and Bi$_2$O$_3$]

| Temperature (° C.) | FIGURE of Merit (ZT) | Electrical Conductivity (σ) | Seebeck Coefficient (V/° C.) | Thermal Conductivity (κ) |
|---|---|---|---|---|
| 25 | 0.65501 | 8.39 × 10$^4$ | −1.78 × 10$^{-4}$ | 1.21245 |
| 50 | 0.74895 | 7.91 × 10$^4$ | −1.85 × 10$^{-4}$ | 1.17467 |
| 100 | 0.82190 | 7.10 × 10$^4$ | −1.88 × 10$^{-4}$ | 1.14369 |
| 150 | 0.79446 | 6.38 × 10$^4$ | −1.87 × 10$^{-4}$ | 1.19297 |

TABLE 5

[Comparative Example 2: non-addition of Bi$_{1.99}$Te$_{2.68}$Se$_{0.28}$ + Cu$_{0.05}$, and Bi$_2$O$_3$]

| Temperature (° C.) | FIGURE of Merit (ZT) | Electrical Conductivity (σ) | Seebeck Coefficient (V/° C.) | Thermal Conductivity (κ) |
|---|---|---|---|---|
| 25 | 0.75120 | 4.78 × 10$^4$ | −2.26 × 10$^{-4}$ | 0.97311 |
| 50 | 0.78972 | 4.57 × 10$^4$ | −2.30 × 10$^{-4}$ | 0.98680 |
| 100 | 0.80515 | 4.27 × 10$^4$ | −2.25 × 10$^{-4}$ | 1.00472 |
| 150 | 0.71561 | 4.24 × 10$^4$ | −2.12 × 10$^{-4}$ | 1.12743 |

Second Embodiment

Paste Composition for a Thermoelectric Element

Like in the first embodiment, in the second embodiment, with regard to the thermoelectric material containing the thermoelectric powder and the metal oxide powder, examples for implementing a composition capable of improving thermoelectric efficiency are presented.

The thermoelectric material according to the second embodiment (hereinafter referred to as 'a paste composition for a thermoelectric element') may be used in producing a thick film thermoelectric element using a printing mechanism. In the case of the conventional bulk-type thermoelectric element, it is difficult to implement the integration of a thermoelectric leg and to produce a flexible element because the conventional bulk-type thermoelectric element has a large thickness. On the contrary, in the case of the thick film-type thermoelectric element, since a thermoelectric leg has a thickness of several-hundred micrometers or less, it is advantageous in that a high power density and integration can be realized thank to the thin thickness, flexibility and low internal resistance. Also, when the thermoelectric element is produced using the printing mechanism, the thermoelectric element can be produced in large quantities at low cost because a production process can be simply and rapidly and a production cost can be reduced.

The paste composition of the present embodiment contains a mixture in which 70 to 90 wt % of a Bi—Te—Sb or Bi—Te—Se-based thermoelectric powder, 2 to 4 wt % of a glass frit, 8 to 12.5 wt % of a vehicle, 0.1 to 0.8 wt % of a metal oxide, and 0.5 to 10 wt % of an additive are mixed.

Since the thermoelectric powder is contained in the form of a Bi—Te—Sb or Bi—Te—Se-based compound showing thermoelectric performance rather than the form of a individual powder mixture of Bi, Te and Sb, a heat treatment process for hot sintering is not needed for the thermoelectric powder.

The thermoelectric powder may be composed of two kinds of thermoelectric powder such as 25 to 35 wt % of a first thermoelectric powder having a particle size of 1 to 3 μm as shown in FIG. 7 and 45 to 55 wt % of a second thermoelectric powder having a particle size of 6 to 8 μm as shown in FIG. 8.

The P-type Bi—Te—Sb-based compound may be, for example, Bi$_{2-x-y}$Sb$_{x-y}$Te$_3$Ag$_y$ (0.1<x<0.5, 0<y<0.1) or Bi$_{2-x}$Sb$_x$Te$_3$ (0.1<x<0.5, 0<y<0.1), but is not limited thereto. The N-type Bi—Te—Se-based compound may be Bi$_2$Te$_{3-x-y}$Se$_x$Cu$_y$ (0.1<x<0.5, 0<y<0.1) or Bi$_2$Te$_{3-x}$Se$_x$ (0.1<x<0.5, 0<y<0.1), but is not limited thereto.

The glass frit serves as a binder that enables an increase of adhesive strength with a substrate and connects the thermoelectric powder and the metal oxide to each other, and provides flexibility to the produced thermoelectric element. For example, a PbO—SiO$_2$—B$_2$O$_3$—Al$_2$O$_3$-based compound as shown in FIG. 9 may be used in the glass frit. More specifically, it is preferable to use a glass frit in which a rate of PbO:SiO$_2$:B$_2$O$_3$:Al$_2$O$_3$ is 50 to 70:10 to 15:13 to 20:5 to 15. As a transparent dielectric, the glass frit enables the composition to have a low plastic property by reducing a melting point of the composition. When a content of the glass frit is less than 2 wt %, it is difficult for the glass frit to serve as an inorganic binder. When a content of the glass frit is more than 4 wt %, an electrical property of the thermoelectric element may be reduced. Accordingly, the glass frit may be contained in an amount of 2 to 4 wt %.

The vehicle is that an organic binder dissolves in a solvent. According to circumstances, a supplemental agent such as an antifoaming agent, a dispersing agent or the like may be further included.

The solvent enables the increase of resolution upon the printing process by adjusting a density of the paste, but when a rate of addition is too high, the resolution is decreased. An organic solvent such as terpineol, carbitol, hexyl carbitol, butyl carbitol, butyl carbitol acetate, texonol, dimethyl adipate and the like may be used as the solvent.

The binder functions to prevent the powdered thermoelectric materials from being scattered upon depositing a thick film. Acrylic resin, cellulose resin, alkyd resin and the like may be used as the binder. However, the present disclosure is not limited thereto, and various organic vehicles may be used.

A content of the vehicle may range from 8 to 12.5 wt %. When the content is less than 8 wt %, a viscosity becomes too high, and accordingly, it may be difficult to perform printing. When the content is more than 12.5 wt %, a viscosity becomes low, and according to it may be difficult to perform printing.

Examples of the additive may include a metal oxide, a plasticizer, an antifoaming agent, a dispersing agent, a thixotropic agent, a surfactant and the like. For example, the metal oxide may be at least one oxide selected from the group consisting of V$_2$O$_5$, NiO, CuO, Cu$_2$O, Bi$_2$O$_3$, TeO$_2$, CeO$_2$, PbO, Tl$_2$O$_3$, and a mixture thereof. When at least two kinds of metal oxides are included, it is preferable that a total content of the metal oxides be less than 0.8 wt %. Each of the metal oxides may be contained in an amount of 0.1 to 0.4 wt %. This is because a carrier concentration of the metal oxide is changed. Furthermore, an effect may be generated when the metal oxide is added in the amount of 0.1 wt % or more, and a reduction in performance of the element may be generated when the metal oxide is added in the amount of 0.1 wt % or more.

A dispersing agent may be added in order to reduce a viscosity of the paste when there is a large amount of solid. For example, a tall oil fatty acid (TOFA) or glyceryl monooleate may be used as the dispersing agent. This component may be the main constitutive component of a metal process oil and may be used as the feedstock of a polyamide dimer fatty acid. When a content of the dispersing agent is less than 1.0 wt %, there is no effect resulting from adding the dispersing agent. When a content of the dispersing agent is more than 1.5 wt %, it is difficult to easily perform printing because fluidity is increased. Thus, it is preferable to add the dispersing agent in the amount of 1.0 to 1.5 wt %

The thixotropic agent is a polymer having an acid value of 5 or less and an amine value of 7 or less in a powder form and is added for the maintenance of form after printing. When a content of the thixotropic agent is less than 0.5 wt %, an effect resulting from adding the thixotropic agent is insignificant. When a content of the thixotropic agent is more than 1.5 wt %, a printing property is reduced because a viscosity is increased. Thus, it is preferable to add the thixotropic agent in the amount of 0.5 to 1.5 wt %.

The paste composition of the present disclosure may include additional solvents selected from the group consisting of texanol, carbitol, butyl carbitol and dimethyl adipate in an amount of 1.7 wt % or more.

[Manufacturing Method of Thermoelectric Element and Thermoelectric Element]

According another aspect of the present embodiment, a method of manufacturing a thermoelectric element may include: printing an Ag or Cu electrode and performing drying; printing a nickel diffusion prevention film and performing drying; and printing the paste composition for the thermoelectric element and performing drying.

Since the method of manufacturing the thermoelectric element according to the present embodiment may enable production of the electrodes having a multilayered structure by a series of processes using a printing mechanism, a production process can be simplified and can be rapidly performed, and a production cost can be reduced. Thus, it is advantageous in that the thermoelectric element can be manufactured in large quantities at low cost.

For example, a gravure coating method, a doctor blade method, a bar coating method, a screen printing method and the like may be used as the printing method. The electrodes may be printed on the substrate. Various substrates such as an alumina substrate, a glass substrate, a semiconductor wafer substrate, a flexible plastic substrate, a paper substrate and the like may be used as the substrate according to its purpose of use.

As such, when the desired patterns are printed on the substrate, leveling for uniformity of the patterns is performed, and thereafter, the printed substrate is dried for 10 to 20 minutes in an oven having a temperature of about 100 to 200° C. in order to vaporize the solvent contained in the paste.

A thickness of the thick film formed on the substrate may be several to hundreds of μm in the range of, for example, less than 1000 μm. Preferably, the thick film may have a thickness of 10 to 250 μm.

The present disclosure will be hereinafter described in greater detail based on examples. The examples have been disclosed for illustrative purposes and the present disclosure may, however, be embodied in different forms and should not be construed as limited to the examples set forth herein.

PRODUCTION EXAMPLE

Production Example 4

Production of a P-Type Ingot

Weighing of each of Bi, Sb, and Te samples was performed to form the condition of $Bi_{0.5}Sb_{1.5}Te_3$, and the samples were sealed in an inactive atmosphere in a state of being accommodated in a quartz tube. Then, the samples accommodated in the quartz tube were put in a furnace and melted at a temperature of 800° C. for 10 hours, and the melted samples were subjected to quenching to produce an ingot.

Production Example 5

Production of an N-Type Ingot

Weighing of each of Bi, Sb, and Te samples was performed to form the condition of $Bi_2Te_{2.70}Se_{0.30}$, and the samples were sealed in an inactive atmosphere in a state of being accommodated in a quartz tube. Then, the samples accommodated in the quartz tube were put in a furnace and melted at a temperature of 800° C. for 10 hours, and the melted samples were subjected to quenching to produce an ingot.

Production Example 6

Production of Thermoelectric Powder

The ingots obtained in Production Examples 4 and 5 were put in a ball mill, and the ingots and an oxide material were pulverized and mixed for 5 hours, and the mixed powder was subjected to sieving using a sieve of 400 meshes to obtain thermoelectric powder.

EXAMPLE

Examples 3 to 6

Production of a Paste Composition

The thermoelectric powder having a particle size of 1 to 3 μm obtained in Production Example 4, the thermoelectric powder having a particle size of 6 to 8 μm and the glass frit, $PbO(60)-SiO_2(13.4)-B_2O_3(15.4)-Al_2O_3(9.2)$ were prepared in each amount shown in Table 6 below to produce a paste for a thermoelectric element.

TABLE 6

| Division | Example 3 | Example 4 | Example 5 | Example 6 |
|---|---|---|---|---|
| Thermoelectric Powder (1 to 3 μm) | 30 | 32 | 33 | 32 |

TABLE 6-continued

| Division | Example 3 | Example 4 | Example 5 | Example 6 |
|---|---|---|---|---|
| Thermoelectric Powder (6 to 8 μm) | 50 | 52 | 53 | 53 |
| Glass frit | 4 | 4 | 2 | 3 |
| Vehicle (acryl resin + terpineol) | 12.5 | 8 | 8 | 8 |
| Metal Oxide 1 (NiO) | 0.5 | 0.4 | 0.4 | 0.4 |
| Metal Oxide 2 (CuO) | 0 | 0.4 | 0.4 | 0.4 |
| Dispersing Agent | 1.5 | 1.0 | 1.0 | 1.0 |
| Thixotropic Agent | 1.5 | 0.5 | 0.5 | 0.5 |
| Additional Solvents (Texanol) | 0 | 1.7 | 1.7 | 1.7 |
| Total Weight (wt %) | 100.0 | 100.0 | 100.0 | 100.0 |

The paste for a thermoelectric element produced in the example was printed on an Ag electrode using a gravure coating method and was then dried at a temperature of 180° C. for 20 minutes to produce a thermoelectric element.

After observing a cross section of the thermoelectric element using an SEM (Scanning Electron Microscope), the cross section was illustrated in FIG. 10. (A) of FIG. 10 shows the thermoelectric element resulting from performing printing two times in a thickness of 50 μm, (B) of FIG. 10 shows the thermoelectric element resulting from performing printing in a thickness of 23 μm, and (C) of FIG. 10 shows the thermoelectric element resulting from performing printing in a thickness of 18 μm.

Comparative Example 3

The same thermoelectric powder as that used in the examples was put in a sintering mold (a thickness of 1000 μm) and was subjected to sintering at a pressure of 60 MPa and a temperature of 420° C. for 30 minutes to produce a bulk type thermoelectric element. A cross section of the thermoelectric element was observed using an SEM (Scanning Electron Microscope) and was illustrated in FIG. 11.

[Evaluation]

(1) Measurement of the Figure of Merit

The results of measuring the figure of merit ZT with regard to the produced thermoelectric element are shown in FIG. 12. As can be seen from the results, the thermoelectric element using the paste composition according to the embodiment of the present disclosure has the highest figure of merit in the area of a low temperature of 25 to 50° C.

(2) Measurement of Cooling Capacity and Delta T

The bulk-type thermoelectric elements produced in each comparative example and the thick film-type thermoelectric elements produced in each example were produced in cells having various sizes, and thereafter, cooling capacity Qc with regard to each thermoelectric element and a difference in temperatures ΔTmax between a heating part and a cooling part were measured. The results thereof are shown in Table 7 below.

TABLE 7

| Type | Cell Width (mm) | Cell Length (mm) | Cell Height (mm) | Resistance (R: ohm) = Vmax/Imax | Qc (W) | ΔTmax (° C.) |
|---|---|---|---|---|---|---|
| Bulk 1 | 1.4 | 1.4 | 1 | 2.76224 | 61.848 | 74.1664 |
| Bulk 2 | 1.45 | 1.45 | 1.37 | 2.946895 | 46.51225 | 72.912475 |
| Bulk 3 | 1.4 | 1.4 | 1.3 | 3.01664 | 48.108 | 74.1214 |
| Bulk 4 | 0.9 | 0.9 | 1.25 | 4.01614 | 37.403 | 83.8004 |

TABLE 7-continued

| Type | Cell Width (mm) | Cell Length (mm) | Cell Height (mm) | Resistance (R: ohm) = Vmax/Imax | Qc (W) | ΔTmax (° C.) |
|---|---|---|---|---|---|---|
| Bulk 5 | 1.45 | 1.45 | 1 | 2.633135 | 63.45825 | 72.967975 |
| Bulk 6 | 1.45 | 1.45 | 1.37 | 2.946895 | 46.51225 | 72.912475 |
| Bulk 7 | 2 | 2 | 1.3 | 1.1684 | 71.16 | 56.965 |
| Thick Film 1 | 1 | 1 | 0.5 | 3.208 | 73.9 | 82.315 |
| Thick Film 2 | 1.2 | 1.2 | 0.5 | 2.80936 | 78.872 | 78.6146 |
| Thick Film 3 | 1.3 | 1.3 | 0.5 | 2.58286 | 81.697 | 76.5121 |
| Thick Film 4 | 1 | 1 | 0.22 | 2.97056 | 86.724 | 82.357 |
| Thick Film 5 | 1 | 1 | 0.23 | 2.97904 | 86.266 | 82.3555 |
| Thick Film 6 | 1 | 1 | 0.21 | 2.96208 | 87.182 | 82.3585 |
| Thick Film 7 | 1 | 1 | 0.15 | 2.9112 | 89.93 | 82.3675 |
| Thick Film 8 | 1.3 | 1.3 | 0.15 | 2.28606 | 97.727 | 76.5646 |
| Thick Film 9 | 1.3 | 1.3 | 0.1 | 2.24366 | 100.017 | 76.5721 |
| Thick Film 10 | 1.3 | 1.3 | 0.02 | 2.17582 | 103.681 | 76.5841 |
| Thick Film 11 | 1.6 | 1.6 | 0.1 | 1.45544 | 109.848 | 69.2554 |
| Thick Film 12 | 1.8 | 1.8 | 0.1 | 0.83936 | 117.532 | 63.5366 |
| Thick Film 13 | 2 | 2 | 0.1 | 0.1508 | 126.12 | 57.145 |

Among the bulk-type and thick film-type thermoelectric elements in Table 7 above, comparing the thick film-type thermoelectric element 10 and the bulk-type thermoelectric element 7, it could be confirmed that the thick film-type thermoelectric element 10 of the present disclosure has a twice increased resistance value compared to that of the bulk-type thermoelectric element 7, and also has the cooling capacity increased by about 40%, and a difference in temperatures between the heating part and the cooling part increased by 30% or more.

As set forth above, according to some embodiments of the present disclosure, the bulk nanocrystlline thermoelectric material for a thermoelectric element containing the metal oxide powder and the thermoelectric powder having a rod form is provided so that an internal filling rate can be improved, thereby maximizing a Peltier effect according to the increase of electrical conductivity and a Seebeck coefficient and the reduction of thermal conductivity and improving the figure of merit ZT of the thermoelectric element.

Also, according to some embodiments of the present disclosure, the paste composition for manufacturing the thick film thermoelectric element using a printing mechanism including a mixture in which 70 to 90 wt % of a Bi—Te—Sb or Bi—Te—Se-based thermoelectric powder, 2 to 4 wt % of a glass frit, 8 to 12.5 wt % of a vehicle, 0.1 to 0.8 wt % of a metal oxide and 0.5 to 10 wt % of an additive are mixed, and the thick film thermoelectric element having improved thermoelectric efficiency manufactured by performing printing with the paste composition for the thermoelectric element are provided. Thus, the thick film thermoelectric element has an excellent competitive price and flexibility compared to the bulk-type thermoelectric element. Thus, it is advantageous in that the thick-type thermoelectric element can be applied to various devices and can enable the achievement of a maximum power density via thick film deposition in several-hundred micrometers, a production process can be simply and rapidly performed, and a production cost can be reduced, thereby enabling mass production of a thermoelectric element at low cost. In particular, since thick film deposition can be performed in several-hundred micrometers, a maximum power density can be realized, and since the thick-type thermoelectric element includes a flexible glass fiber, an easily bendable property can be implemented.

The present disclosure has been made keeping in mind the above problems, an aspect of embodiments of the present disclosure provides a nanocrystalline thermoelectric material containing metal oxide powder and thermoelectric powder for improving an internal filling rate so that a Peltier effect can be maximized according to the increase of electrical conductivity and a Seebeck coefficient and the decrease of thermal conductivity, thereby enabling improvement of the figure of merit ZT of a thermoelectric element.

Also, another aspect of embodiments of the present disclosure provides a thick film-type thermoelectric element having improved thermoelectric efficiency so as to have an excellent competitive price and flexibility compared to a bulk-type thermoelectric element. Thus, it is advantageous in that the thick-type thermoelectric element can be applied to various devices and can enable the achievement of a maximum power density via thick film deposition in several-hundred micrometers, a production process can be simply and rapidly performed, and a production cost can be reduced, thereby enabling mass production of a thermoelectric element at low cost. In particular, since thick film deposition can be performed in several-hundred micrometers, a maximum power density can be realized, and since the thick-type thermoelectric element includes a flexible glass fiber, an easily bendable property can be implemented.

According to an aspect of embodiments of the present disclosure, a thermoelectric material may include: thermoelectric powder containing at least one element selected from the group consisting of Bi, Sb, Te and Se; and metal oxide powder containing particles each having a cross section with a width and a thickness and each having a length extending from the cross section, so that a nanocrystalline thermoelectric material capable of improving the figure of merit ZT of a thermoelectric element can be provided.

Also, according to another aspect of embodiments of the present disclosure, a paste composition for manufacturing a thick film thermoelectric element using a printing mechanism may include a mixture in which 70 to 90 wt % of a Bi—Te—Sb or Bi—Te—Se-based thermoelectric powder, 2 to 4 wt % of a glass frit, 8 to 12.5 wt % of a vehicle, 0.1 to 0.8 wt % of a metal oxide, 0.5 to 10 wt % of an additive are mixed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thermoelectric material, comprising:
   thermoelectric powder containing at least one element selected from the group consisting of Bi, Sb, Te, and Se; and
   metal oxide powder having an aspect ratio of 1:5 to 1:20, wherein the metal oxide powder is added in an amount of 0.01 to 0.5 wt % based on a total weight of the thermoelectric material.

2. The thermoelectric material of claim 1, which has a bulk form.

3. The thermoelectric material of claim 1, wherein the metal oxide power is at least one oxide selected from the group consisting of $Bi_2O_3$, NiO, and CuO.

4. The thermoelectric material of claim 1, wherein the metal oxide powder has a particle size of 10 nm to 10 µm.

5. The thermoelectric material of claim 1, wherein the thermoelectric powder further contains Ag or Cu.

6. A thermoelectric material, comprising:
   25 to 35 wt % of a first thermoelectric powder having a particle diameter of 1 to 3 µm containing at least one selected from Bi—Te—Sb based powder and Bi—Te—Se based powder;
   45 to 55 wt % of a second thermoelectric powder having a particle size of 6 to 8 µm containing at least one selected from Bi—Te—Sb based powder and Bi—Ti—Se based powder;
   0.1 to 0.8 wt % of a metal oxide;
   2 to 4 wt % of a glass frit;
   8 to 12.5 wt % of a vehicle; and
   0.5 to 10 wt % of an additive.

7. The thermoelectric material of claim 6, wherein the first or second thermoelectric powder is P-type powder selected from $Bi_{2-x-y}Sb_{x-y}Te_3Ag_y$ or $Bi_{2-x}Sb_xTe_3$ (where, $0.1<x<0.5$, $0<y<0.1$).

8. The thermoelectric material of claim 6, wherein the first or second thermoelectric powder is N-type powder selected from $Bi_2Te_{3-x-y}Se_xCu_y$ or $Bi_2Te_{3-x}Se_x$ (where, $0.1<x<0.5$, $0<y<0.1$).

9. The thermoelectric material of claim 6, wherein the glass frit is a $PbO$—$SiO_2$—$B_2O_3$—$Al_2O_3$-based glass frit.

10. The thermoelectric material of claim 6, wherein the vehicle is formed by dissolving an organic binder in a solvent,
    wherein the solvent is selected from the group consisting of terpineol, carbitol, hexyl carbitol, butyl carbitol, butyl carbitol acetate, texonol, and dimethyl adipate, and
    the binder is at least one resin selected from the group consisting of acrylic resin, cellulose resin and alkyd resin.

11. The thermoelectric material of claim 6, wherein the metal oxide is at least one oxide selected from the group consisting of $V_2O_5$, NiO, CuO, $Cu_2O$, $Bi_2O_3$, $TeO_2$, $CeO_2$, PbO, $Tl_2O_3$, and a mixture thereof.

12. The thermoelectric material of claim 6, wherein the additive further comprises at least one supplemental agent selected from the group consisting of a plasticizer, an antifoaming agent, a dispersing agent, a thixotropic agent, and a surfactant.

13. The thermoelectric material of claim 6, further comprising 1.7 wt % or more of an additional solvent.

14. A thermoelectric element comprising a thermoelectric material according to claim 6, the thermoelectric element having a thick film structure with a thickness of 10 to 250 μm.

* * * * *